United States Patent
Huang et al.

(10) Patent No.: US 6,648,065 B2
(45) Date of Patent: Nov. 18, 2003

(54) HEAT-DISSIPATING MODULE

(75) Inventors: Wen-Shi Huang, Taoyuan Sien (TW); Kuo-Cheng Lin, Taoyuan (TW); Tsu-Liang Lin, Taoyuan Sien (TW); Tsung-Yu Lei, Taoyuan Sien (TW)

(73) Assignee: Delta Electronics, Inc., Taoyuan Sien (TW)

( * ) Notice: Subject to any disclaimer, the term of this patent is extended or adjusted under 35 U.S.C. 154(b) by 18 days.

(21) Appl. No.: 10/143,303

(22) Filed: May 9, 2002

(65) Prior Publication Data

US 2002/0170703 A1 Nov. 21, 2002

(30) Foreign Application Priority Data

May 18, 2001 (TW) .................................. 90208104 U (51) Int. Cl.[7] ................................................ H05K 7/20
(52) U.S. Cl. ...................... 165/121; 165/80.3; 361/697
(58) Field of Search ............................... 165/803, 120, 165/121, 185; 361/697, 704

(56) References Cited

U.S. PATENT DOCUMENTS

| | | | | | |
|---|---|---|---|---|---|
| 5,297,617 | A | * | 3/1994 | Herbert | 165/80.3 |
| 5,745,041 | A | * | 4/1998 | Moss | 340/635 |
| 6,219,242 | B1 | * | 4/2001 | Martinez | 361/704 |
| 6,343,014 | B1 | * | 1/2002 | Lin | 361/697 |
| 6,367,542 | B1 | * | 4/2002 | Chen | 165/80.3 |
| 6,396,688 | B1 | * | 5/2002 | Davies et al. | 361/687 |
| 6,526,333 | B1 | * | 2/2003 | Henderson et al. | 700/300 |

* cited by examiner

*Primary Examiner*—Allen Flanigan
(74) *Attorney, Agent, or Firm*—Thomas, Kayden, Horstemeyer & Risley (57) ABSTRACT

A heat-dissipating module includes a heat sink and a fan device. The fan device may be disposed on the heat sink, or inserted into the heat sink to reduce the height. The fan device includes a first rotor blade and a second rotor blade. The first rotor blade and the second rotor blade are connected in series. The rotation speed of the first rotor blade is controlled by a first control circuit, and the second rotor blade is controlled by the second circuit. Thus, the second control circuit increases the rotation speed of the second rotor blades when the first rotor blades is failed.

20 Claims, 7 Drawing Sheets

HEAT-DISSIPATING MODULE

FIELD OF THE INVENTION

The present invention relates to a heat-dissipating module, particularly to a heat-dissipating module with high heat dissipation efficiency and backup function.

BACKGROUND OF THE INVENTION

As the efficiency of electric devices improves, heat-dissipating devices have become indispensable components of many electric devices. Without appropriate heat dissipation, the electric devices may burn out, or its performance will be reduced. Hence, for heat radiation, a heat-dissipating device is usually disposed on the upper or lateral surface of a device, such as a CPU, generating a lot of heat during the operating process.

Figure 1A:
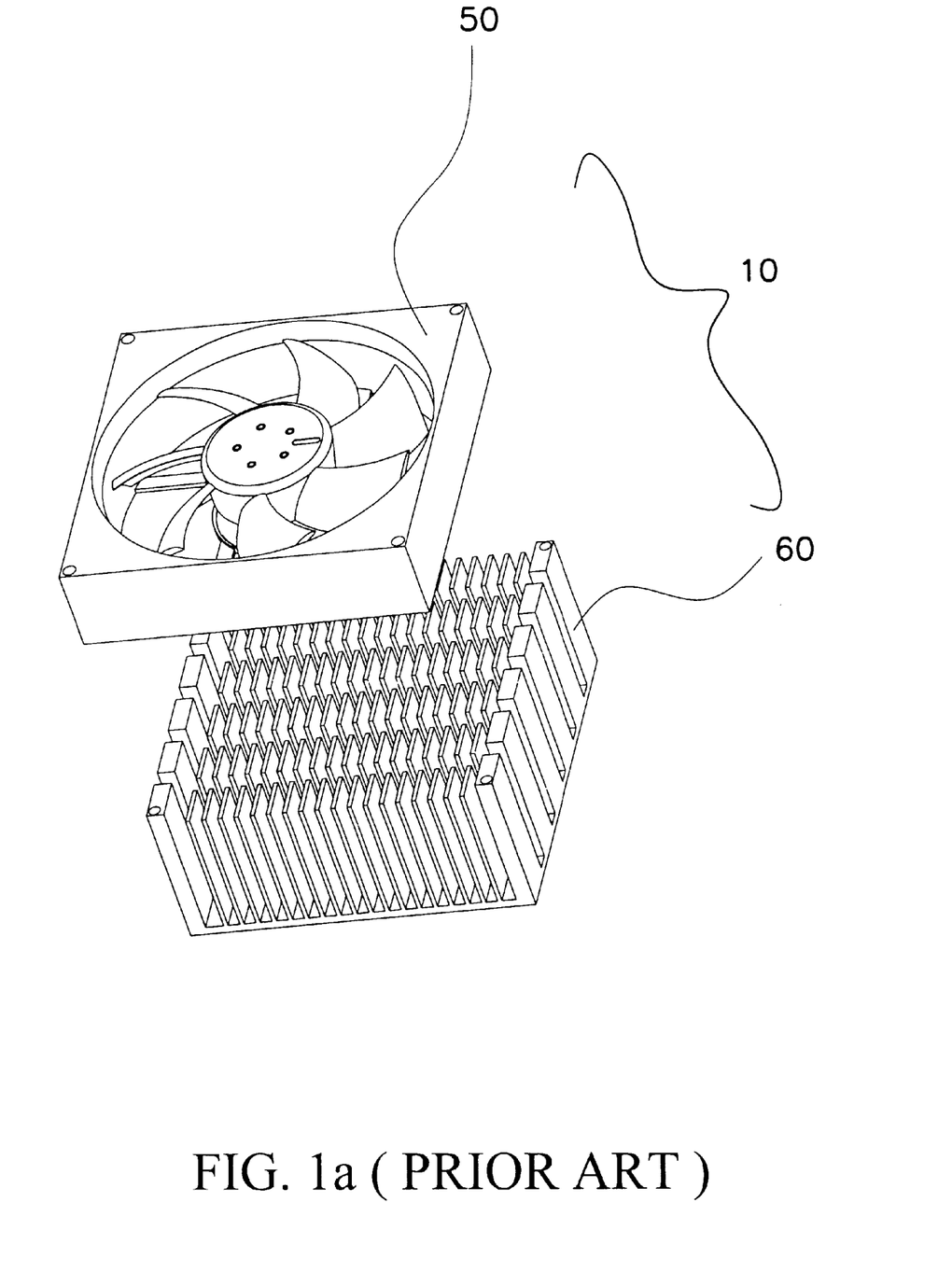
FIG. 1(a) shows a traditional cooler device.

FIG. 1(a) shows a conventional cooler 10, comprised of a fan 50 and a heat sink 60. The fan 50 is disposed on the upper surface of the heat sink 60, and the heat sink 60 is attached to a heat source (not shown), such as a CPU. The disadvantages of the conventional cooler 10 designs are (1) unsatisfactory heat dissipating performance and (2) lack of redundant function. The disadvantages are further described below:

In FIG. 1(a), the conventional cooler 10 has only one fan 50. If the fan 50 is failed in operation, the cooler 10 will fail to provide appropriate heat radiation and the CPU may burn out.

Figure 1B:
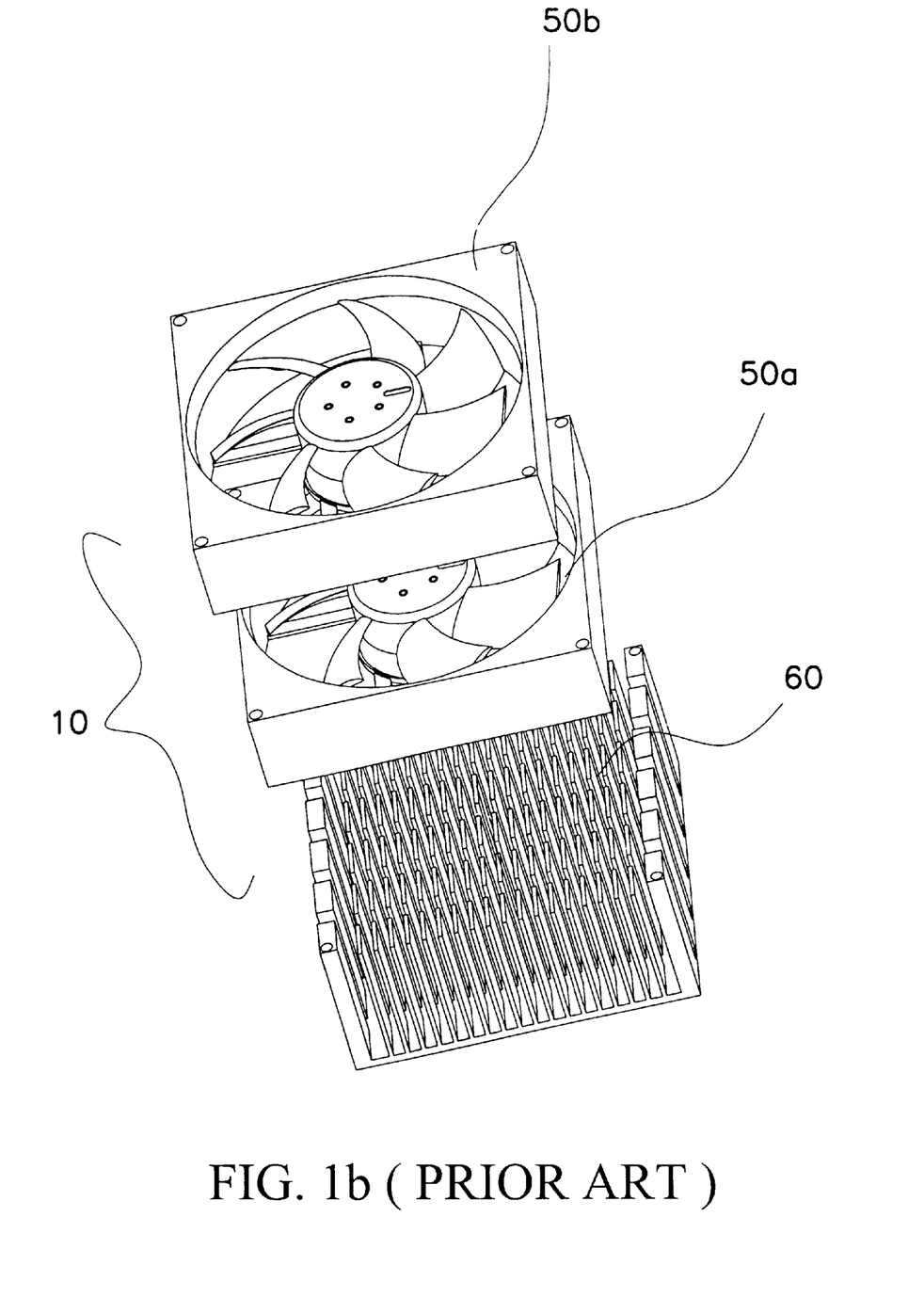
FIG. 1(b) shows another traditional cooler device.

Furthermore, as the operating performances of the electric device increase, the cooler only having a single fan may not be sufficient. Therefore, as shown in FIG. 1(b), a structure that comprises two fan units 50a, 50b is proposed to increase the heat-dissipating efficiency. According to this design, although the cooler 10 may provide a backup function while one fan unit is failed, both of them will be interfered with each other such that it is hard to obtain the predetermined heat-dissipating effect and the noise will be greatly increased.

Figure 1C:
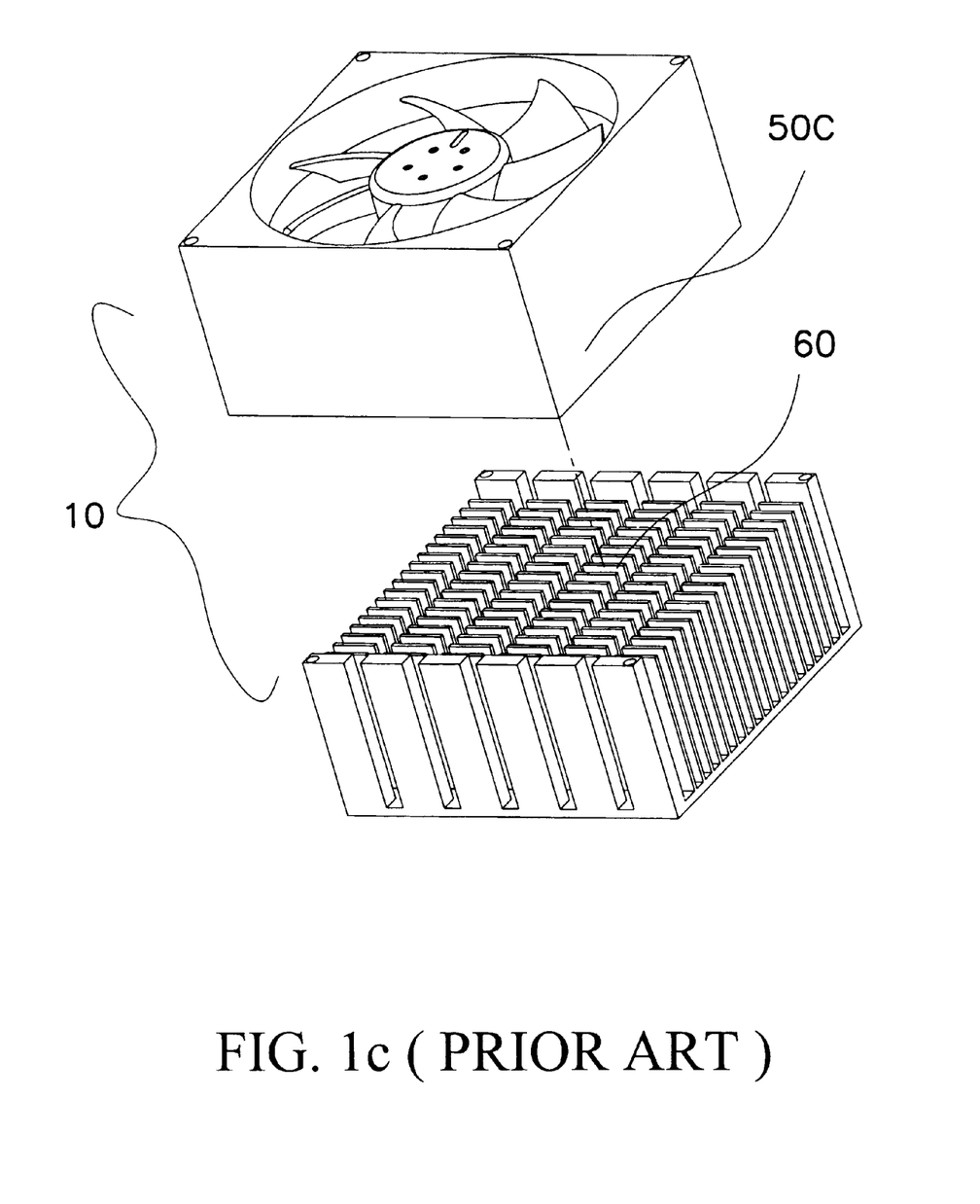
FIG. 1(c) shows another traditional cooler device.

FIG. 1(c) shows another solution. A structure having a larger fan 50c is proposed to increase the heat-dissipating efficiency. However, this design still has the problem of the lack of backup function.

Hence, an innovative cooler device is required to solve the problems mentioned above.

SUMMARY OF THE INVENTION

To solve the problems mentioned above, the present invention proposes a heat-dissipating module with a better dissipating efficiency and the backup function.

Accordingly, this invention provides a heat-dissipating module. The heat-dissipating module comprises a heat sink and a fan device. The heat sink is provided with a plurality of cooling fins. The fan device, disposed on the heat sink, is provided with a first rotor blade, a second rotor blade, a base, an outer frame, and a plurality of ribs. The base is provided with a first support and a second support. The first support and the second support extend in opposite directions. The first support is coupled to the first rotor blade, and the second support is coupled to the second rotor blade. The first rotor blade and the second rotor blade are surrounded by the outer frame. The ribs extend from the base to the outer frame.

Furthermore, the first rotor blade raises its rotation speed when the second rotor blade is failed, and the second rotor blade raises its rotation speed when the first rotor blade is failed. That is, the first rotor blade and the second rotor blade are electrically coupled. The rotation speed of the first rotor blade is controlled by a first control circuit and a first output terminal. The rotation speed of the second rotor blade is controlled by a second circuit and a second output terminal. The first output terminal is coupled to the second control circuit, and the second output terminal is coupled to the first control circuit. Each of the first and second output terminals is adapted to send out a signal indicating whether the rotation speed of the rotor blade is normal. For example, the signal is "1" if the corresponding rotation speed is normal, and "0" if the rotation speed is abnormal. However, a contrary arrangement of the signal is also possible.

Furthermore, when the first and second rotor blades are running normally, they both operate at lower speed. However, if a malfunction occurs in one of them, the other raises its rotation speed. For example, if the first rotor blade malfunctions, the second control circuit receives the abnormal signal sent from the first output terminal and drives the second rotor blade to speed up, thereby compensating the efficiency loss. To achieve this operation, it is important that the first and second rotor blades are both operate in at least one high-speed mode and one low-speed mode. In other words, the rotor blades need to be dual-speed.

Furthermore, to reduce noise and increase heat-dissipating efficiency, the rotation directions of the first and second rotor blades are opposite such that the two airflows tangent to the rotor blades may counteract and the airflow along the shaft direction is more concentrated. Of course, the rotation directions and speeds of the first and second rotor blade can also be the same.

In another preferred embodiment, the heat-dissipating module comprises a heat sink, a first rotor blade, a second rotor blade and a base. The heat sink is provided with a plurality of cooling fins and a space defined by the cooling fins. The first rotor blade and the second rotor blade are connected in series, and are located in the space.

Furthermore, the heat-dissipating module comprises an outer frame, a plurality of ribs, a first support, and a second support. The first support and the second support extend in opposite directions. The first support is coupled to the first rotor blade, and the second support is coupled to the second rotor blade. The ribs extend from the base to the outer frame.

Furthermore, the first rotor blade raises its rotation speed when the second rotor blade is failed, and the second rotor blade raises its rotation speed when the first rotor blade is failed

BRIEF DESCRIPTIONS OF THE DRAWINGS

The present invention can be fully understood from the following detailed description and preferred embodiment with reference to the accompanying drawings in which.

DETAILED DESCRIPTION OF THE INVENTION

The heat-dissipating module of the present invention is disposed on the surface of a heat source (not shown), such as a CPU, for heat dissipation.

The First Embodiment

Figure 2A:
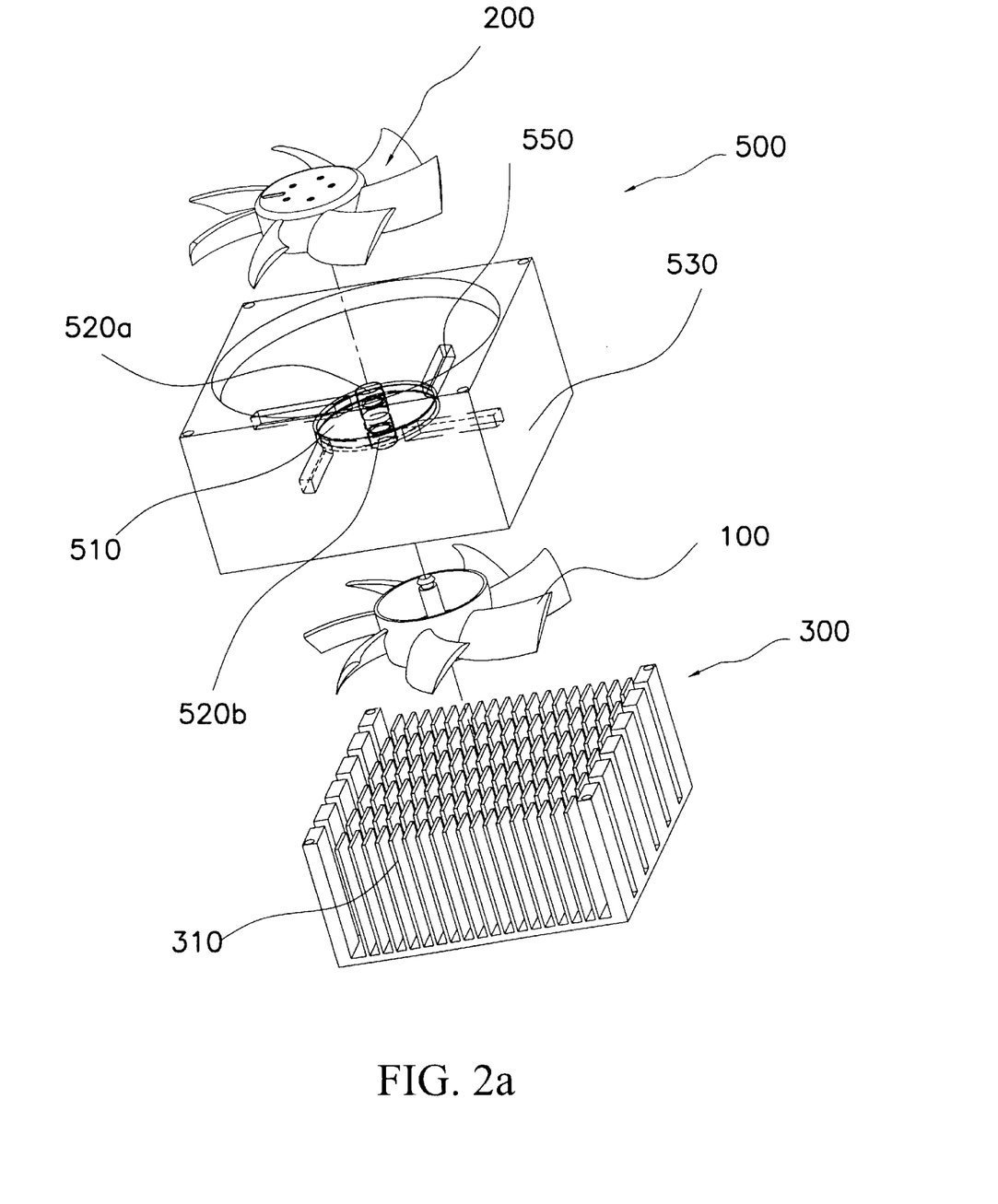
FIG. 2(a) shows an exploded view of a first embodiment of the present invention.

Refer to FIG. 2(a). In the first embodiment, the heat-dissipating module is comprised of a heat sink 300 and a fan device. The heat sink 300 is comprised of a plurality of cooling fins 310 which can be made of aluminum, aluminum alloy, copper, or copper alloy. The fan device 500, disposed on the heat sink 300, is comprised of a first rotor blade 100 and a second rotor blade 200, a base 510, an outer frame 530, and a plurality of ribs 550. The base 510 includes a first support 520b and a second support 520a extending in opposite directions. The first support 520b is coupled to the first rotor blade 100 and the second support 520a is coupled to the second rotor blade 200, such that the first and second rotor blades 100, 200 are connected in series, and located in the fan device 500. As well, the first and second rotor blades 100, 200 are surrounded by the outer frame 530. The ribs 550 extend from the base 510 to the outer frame 530 respectively.

The heat sink 300 first conducts the heat generated from a heat source to an expanded radiation area. After that, the operation of the first and second rotor blades 100, 200 dissipates the heat to the environment.

Figure 2B:
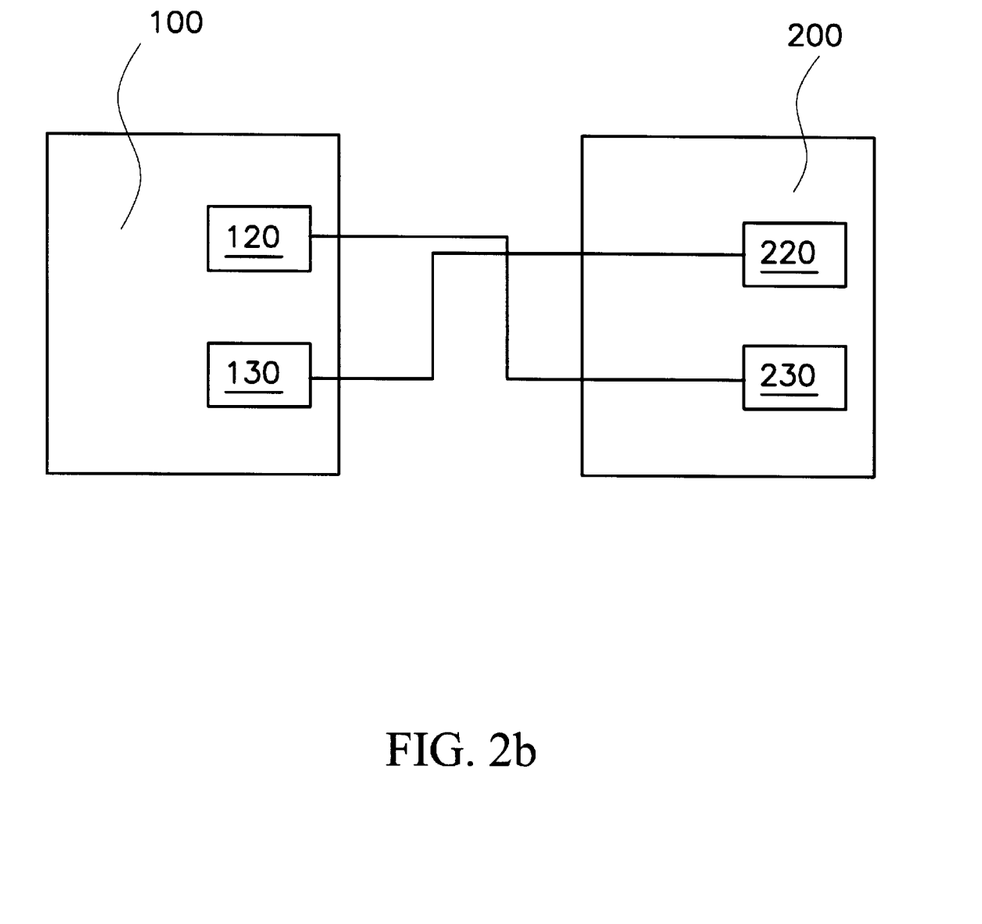
FIG. 2(b) shows a circuit diagram of the present invention.

In the present invention, each of the first and second rotor blades 100, 200 can speedup if one of them is failed. The first and second rotor blades 100, 200 are electrically coupled. A detailed description is shown in FIG. 2(b). The rotation speed of the first rotor blade 100 is controlled by a first control circuit 120 and a first output terminal 130. The rotation speed of the second rotor blade 200 is controlled by a second circuit 220 and a second output terminal 230. The first output terminal 130 is coupled to the second control circuit 220, and the second output terminal 230 is coupled to the first control circuit 120. Each of the first and second output terminals 130, 230 is adapted to send out a signal indicating whether the rotation speed of the rotor blade is normal. In this embodiment, the signal is "1" if the corresponding rotation speed is normal, and "0" if the rotation speed is abnormal. Contrary arrangement of the signal is also possible.

When the first and second rotor blades 100, 200 are running normally, they both operate at lower speed. However, if a malfunction occurs in one of them, the other raises its rotation speed. In this embodiment, for example, as the first rotor blade 100 is failed, the second control circuit 220 receives the abnormal signal sent from the first output terminal 130 and drives the second rotor blade 200 to speed up, thereby compensating for the efficiency loss. To achieve this operation, it is important that the first and second rotor blades 100, 200 operate in at least one high-speed mode and one low-speed mode. In other words, the rotor blades need to be dual-speed.

Furthermore, to reduce noise and increase the efficiency, the rotation direction of the first and second rotor blades 100, 200 can be contrary such that the two airflows tangent to the fans may counteract and the airflow along the shaft direction would be more concentrated. However, the rotation direction of the first and second rotor blades 100, 200 are not limited; for example, the first and second rotor blades 100, 200 can rotate in the same direction.

The Second Embodiment

Figure 3A:
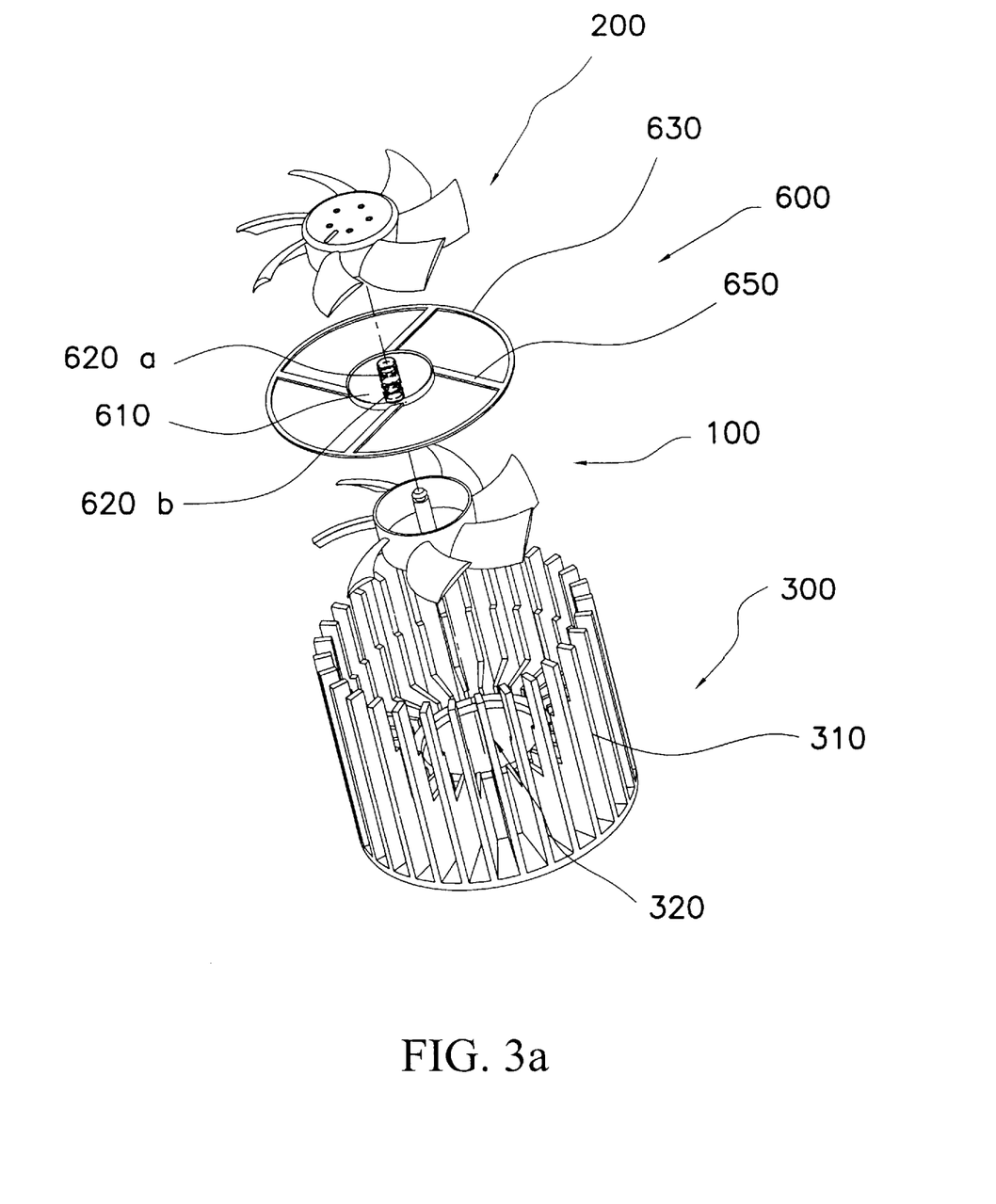
FIG. 3(a) shows an exploded view of a second embodiment of the present invention.
Figure 3B:
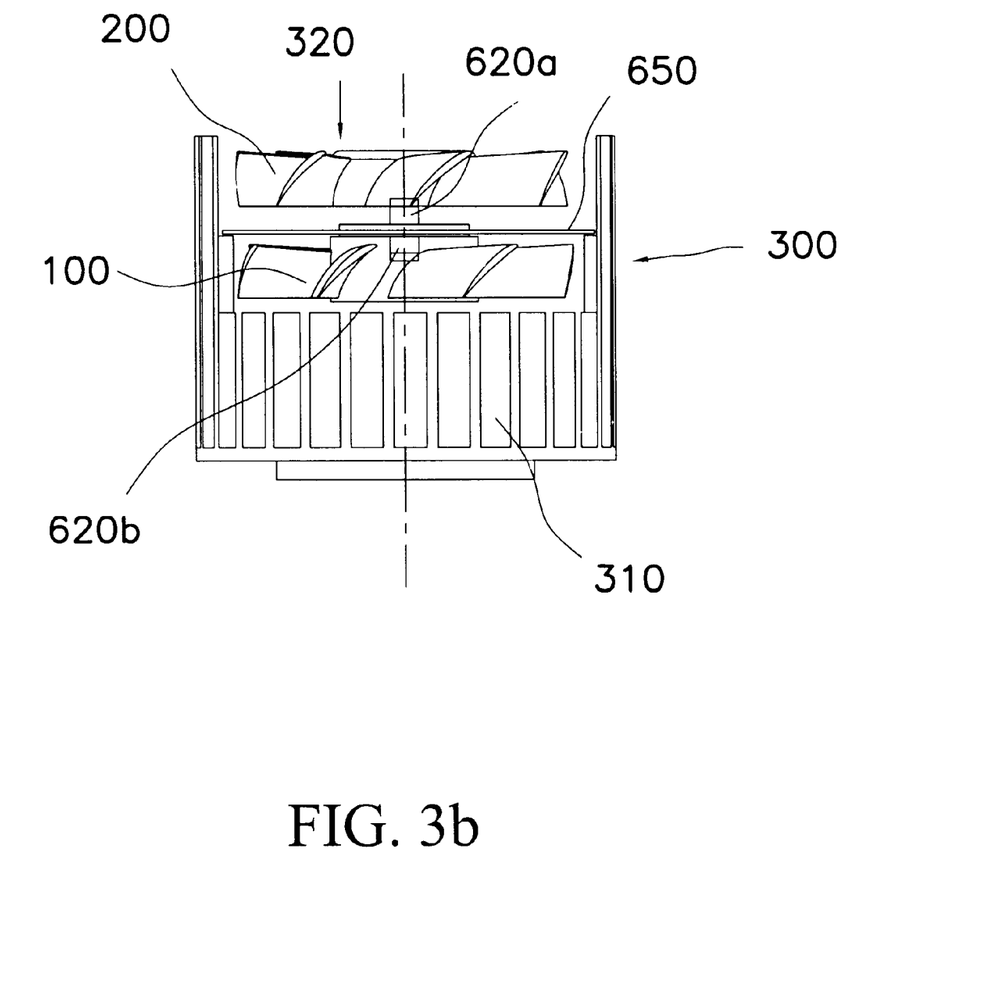
FIG. 3(b) shows a cross-section of a second embodiment of the present invention.

Refer to FIGS. 3(a) and 3(b). In the second embodiment, the heat-dissipating module is comprised of a heat sink 300, a plurality of rotor blades and a base 600. The heat sink 300 is comprised of a plurality of cooling fins 310 and a space 320 defined by the cooling fins 310, as shown in FIG. 3(b). The number of the rotor blades is two in this embodiment. However, the number is not limited to two. The first and second rotor blades 100, 200 are connected in series, and located in the space 320 such that the thickness of the whole module is lowered because the rotor blades are disposed in the heat sink 300. It is noted that the shape of the space 320 is adapted to the first and second rotor blades 100, 200. The heat sink is used to first conduct the heat generated from a heat source to an expanded radiation area. After that, the operation of the first and second rotor blades 100, 200 dissipates the heat to the environment. The cooling fins 310 may be made of aluminum, aluminum alloy, copper, or copper alloy.

The base 600 includes an outer frame 630, a plurality of ribs 650, a first support 620b and a second support 620a. The first and second supports 620b, 620a extend in opposite directions to be respectively coupled to the first rotor blade 100 and the second rotor blade 200, and the outer frame 630 is supported by the cooling fins 310. As well, the ribs 650 extend from the central part 610 to the outer frame 630 respectively.

Each of the first and second rotor blades 100, 200 may speed up if the other is failed. The operating method of this embodiment is similar to that of the first embodiment, such that the unnecessary descriptions are omitted in this application.

Furthermore, to reduce noise and increase heat-dissipating efficiency, the rotation directions of the first and second rotor blades 100, 200 can be opposite such that the two airflows tangent to the rotor blades may counteract and the airflow along the shaft direction is more concentrated.

While the invention has been described with reference to a preferred embodiment, the description is not intended to be construed in a limiting sense. It is therefore contemplated that the appended claims will cover any such modifications or embodiments as may fall within the scope of the invention defined by the following claims and their equivalents.

What is claimed is:

1. A heat-dissipating module comprising:
   a heat sink having a plurality of cooling fins; and
   a fan device, having a base, an outer frame, a first rotor blade and a second rotor blade, and disposed on the heat sink, wherein the first blade and the second rotor blade are connected in series, and are surrounded by the outer frame, and the base includes a first support and a second support opposite to the first support, and the first support is coupled to the first rotor blade and the second support is coupled to the second rotor blade.

2. The heat-dissipating module of claim 1, wherein the fan device further comprises:
a plurality of ribs extending from the base to the outer frame.

3. The heat-dissipating module of claim 1, further comprising a control circuit, wherein the first rotor blade and the second rotor blade are controlled by the control circuit, whereby the control circuit increases the rotation speed of the second rotor blade when the first rotor blade is failed, and increases the rotation speed of the first rotor blade when the second rotor blade is failed.

4. The heat-dissipating module of claim 1, further comprising a first control circuit and a second control circuit, wherein the rotation speed of the first rotor blade is controlled by the first control circuit, and the rotation speed of the second rotor blade is controlled by the second control circuit, whereby the first control circuit sends a signal to the second control circuit to increase the rotation speed of the second rotor blade when the first rotor blade is failed.

5. The heat-dissipating module of claim 1, wherein the first rotor blade and the second rotor blade rotate in opposite directions.

6. The heat-dissipating module of claim 1, wherein the cooling fins are made of aluminum, aluminum alloy, copper, or copper alloy.

7. A heat-dissipating module comprising:
a heat sink having a plurality of cooling fins, wherein the cooling fins define a space;
a base disposed in the space and supported by cooling fins;
a first rotor blade disposed in the space and located between the base and the cooling fins; and
a second rotor blade disposed in the space and located opposite to the first rotor blade relative to the base.

8. The heat-dissipating module of claim 7, further comprising a control circuit, wherein the first rotor blade and the second rotor blade are controlled by the control circuit, whereby the control circuit increases the rotation speed of the second rotor blade when the first rotor blade is failed, and increases the rotation speed of the first rotor blade when the second rotor blade is failed.

9. The heat-dissipating module of claim 7, further comprising a first control circuit and a second control circuit, wherein the rotation speed of the first rotor blade is controlled by the first control circuit, and the rotation speed of the second rotor blade is controlled by the second control circuit, whereby the first control circuit sends a signal to the second control circuit to increase the rotation speed of the second rotor blades when the first rotor blade is failed.

10. The heat-dissipating module of claim 7, wherein the base further includes:
a first support and a second support, wherein the first support is coupled to the first rotor blade and the second support is coupled to the second rotor blade;
an outer frame; and
a plurality of ribs extending from a central part of the base to the outer frame.

11. The heat-dissipating module of claim 10, wherein the first support and the second support extend in opposite directions.

12. The heat-dissipating module of claim 10, wherein the outer frame is supported by the cooling fins.

13. The heat-dissipating module of claim 7, wherein the first rotor blade and the second rotor blade rotate in opposite directions.

14. The heat-dissipating module of claim 7, wherein the cooling fins are made of aluminum, aluminum alloy, copper, or copper alloy.

15. A heat-dissipating module comprising:
a heat sink having a plurality of cooling fins; and
a fan device, having a first rotor blade and a second rotor blade, and disposed on the heat sink, wherein the first rotor blade and the second rotor blade are connected in series, and rotate along opposite directions.

16. The heat-dissipating module of claim 15, wherein the fan device further comprises:
a base having a first support and a second support, wherein the first support is coupled to the first rotor blade and the second support is coupled to the second rotor blade;
an outer frame surrounding the first rotor blade and the second rotor blade; and
a plurality of ribs extending from the base to the outer frame.

17. The heat-dissipating module of claim 15, further comprising a control circuit, wherein the first rotor blade and the second rotor blade are controlled by the control circuit, whereby the control circuit increases the rotation speed of the second rotor blade when the first rotor blade is failed, and increases the rotation speed of the first rotor blade when the second rotor blade is failed.

18. The heat-dissipating module of claim 15, further comprising a first control circuit and a second control circuit, wherein the rotation speed of the first rotor blade is controlled by the first control circuit, and the rotation speed of the second rotor blade is controlled by the second control circuit, whereby the first control circuit sends a signal to the second control circuit to increase the rotation speed of the second rotor blades when the first rotor blade is failed.

19. The heat-dissipating module of claim 15, wherein the cooling fins are made of aluminum, aluminum alloy, copper, or copper alloy.

20. A heat-dissipating module comprising:
a heat sink having a plurality of cooling fins;
a fan device, having an outer frame, a first rotor blade and a second rotor blade, and disposed on the heat sink, wherein the first blade and the second rotor blade are connected in series, and are surrounded by the outer frame; and
a control circuit, wherein the first rotor blade and the second rotor blade are controlled by the control circuit, whereby the control circuit increases the rotation speed of the second rotor blade when the first rotor blade is failed, and increases the rotation speed of the first rotor blade when the second rotor blade is failed.

* * * * *